United States Patent [19]
Kawano

[11] Patent Number: 5,565,795
[45] Date of Patent: Oct. 15, 1996

[54] LEVEL CONVERTING CIRCUIT FOR REDUCING AN ON-QUIESCENCE CURRENT

[75] Inventor: Harumi Kawano, Miyazaki, Japan

[73] Assignee: Oki Electric Industry Co., Ltd., Tokyo, Japan

[21] Appl. No.: 504,734

[22] Filed: Jul. 19, 1995

[30] Foreign Application Priority Data

Aug. 16, 1994 [JP] Japan .................................. 6-191698

[51] Int. Cl.⁶ .............................................. H03K 19/0175
[52] U.S. Cl. ................................ 326/81; 326/68; 326/34
[58] Field of Search ............................ 326/34, 68, 81; 327/530

[56] References Cited

U.S. PATENT DOCUMENTS

| | | | |
|---|---|---|---|
| 4,216,390 | 8/1980 | Stewart | 326/81 |
| 5,117,131 | 5/1992 | Ochi | 326/81 |
| 5,136,189 | 8/1992 | Demaris | 326/81 |
| 5,304,867 | 4/1994 | Morris | 326/68 |
| 5,406,142 | 4/1995 | Nakama | 326/81 |
| 5,444,392 | 8/1995 | Sommer | 326/81 |

Primary Examiner—Edward P. Westin
Assistant Examiner—Andrew Sanders

[57] ABSTRACT

A potential supplied to a first node from an inverter having an NMOS and a PMOS both series-connected between a constant potential node ($V_{DD}$ or GND) and the first node is switched according to a signal input to the inverter. The NMOS can be prevented from being brought into conduction beyond need, thereby making it possible to reduce an on-quiescence current.

12 Claims, 7 Drawing Sheets

5,565,795

LEVEL CONVERTING CIRCUIT FOR REDUCING AN ON-QUIESCENCE CURRENT

BACKGROUND OF THE INVENTION

This invention relates to a level converting circuit capable of amplifying an input signal whose potential varies at an interval (amplitude) smaller than an interval between a source potential and a ground potential. This type of level converting circuit can be used as a circuit such as an interface circuit, a level shifter circuit or the like.

When it is desired to input a signal employed in a TTL (Transistor Transistor Logic) circuit to a MOS circuit, the signal is input thereto through an interface circuit. A level converting circuit is used as the interface circuit.

As the conventional level converting circuit, there is known one in which two inverters are electrically connected in series with each other. If a signal having an amplitude ranging from 0 V to 3 V is input where a source potential is set as 5 V and an input sense level is set as 1.5 V, then a signal having an amplitude ranging from 0 V to 5 V is output.

SUMMARY OF THE INVENTION

It is an object of the present invention to provide a level converting circuit capable of preventing an on-quiescence current from flowing to thereby reduce power consumption.

According to one aspect of the present invention, for achieving the above object, there is provided a level converting circuit comprising a first inverter including a P channel MOS transistor and an N channel MOS transistor both series-connected between a first node and a ground potential node, a second inverter connected to an output of the first inverter, a source potential supply circuit for supplying a source potential to the first node, and a potential supply circuit for supplying a potential lower than the source potential to the first node.

According to another aspect of the present invention, there is provided a level converting circuit comprising a first inverter including a P channel MOS transistor and an N channel MOS transistor both series-connected between a source potential node and a first node, a second inverter connected to an output of the first inverter, a ground potential supply circuit for supplying a ground potential to the first node, and a potential supply circuit for supplying a potential lower than the ground potential to the first node.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1:
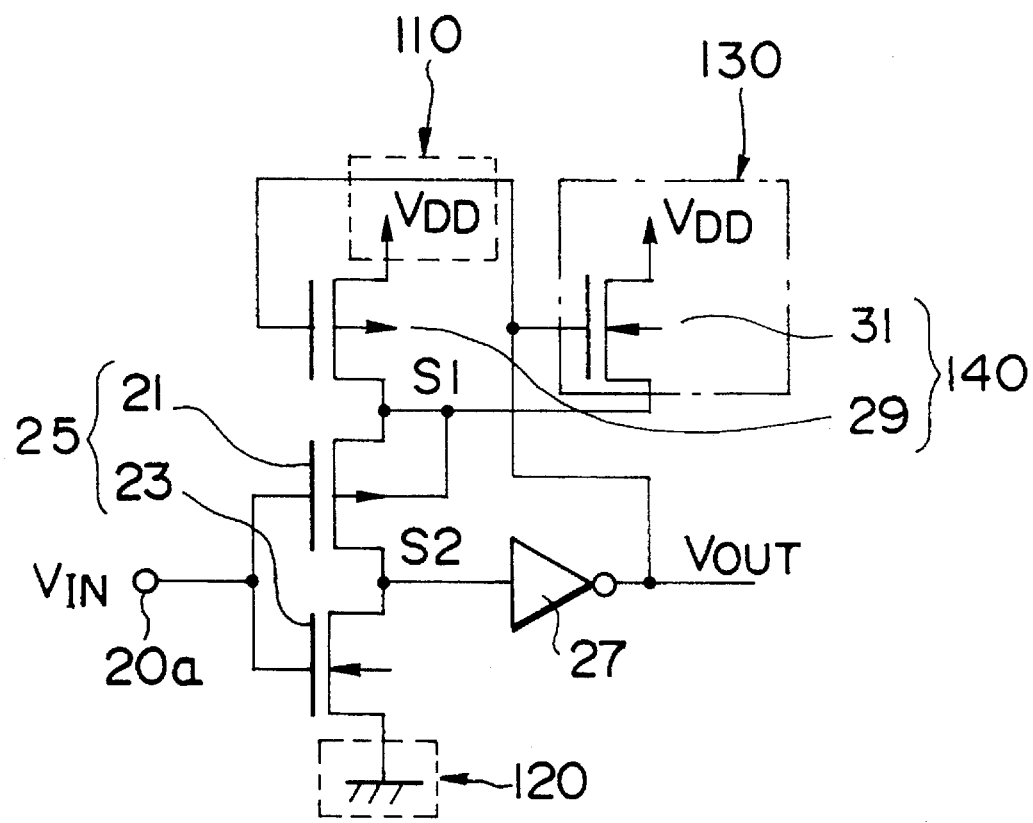
FIG. 1 is a circuit diagram showing a level converting circuit according to a first embodiment of the present invention.

FIG. 1 is a circuit diagram showing a level converting circuit according to a first embodiment of the present invention. The configuration of the level converting circuit 20 will now be described. A p channel MOS transistor (hereinafter called "PMOS") 21 and an N channel MOS transistor (hereinafter called "NMOS") 23 are electrically series-connected between a node S1 and a ground potential 120. The gates of these MOS transistors are electrically connected to an input terminal IN. A terminal on the source side of the PMOS 21 is electrically connected to a node $S_1$ and a terminal on the drain side thereof is electrically connected to a terminal on the drain side of the PMOS 23. A terminal on the source side of the PMOS 23 is electrically connected to a ground potential generating section 120. These MOS transistors constitute an inverter 25. The source of the PMOS 21 and a substrate with the PMOS 21 formed thereon are electrically connected to each other. An output $S_2$ of the inverter 25, i.e., a portion $S_2$ at which the PMOS 21 and the NMOS 23 are electrically connected to each other, is electrically connected to an input of an inverter 27. An output of the inverter 27 is electrically connected to an output terminal OUT.

Further, a PMOS 29 and an NMOS 31 are electrically parallel-connected between a source potential node $V_{DD}$ and the node $S_1$. A terminal on the drain side of each of the PMOS 29 and the NMOS 31 is electrically connected to the source potential $V_{DD}$. A terminal on the source side of each of the PMOS 29 and the NMOS 31 is electrically connected to the node $S_1$. Further, the gates of the PMOS 29 and the NMOS 31 are electrically connected to the output of the inverter 27.

Now, the source potential node $V_{DD}$ to which the terminal on the drain side of the PMOS 29 is electrically connected, will be regarded as a source potential generating section 110.

The source potential $V_{DD}$ and the NMOS 31 forms a potential or voltage generating section 130, which supplies a predetermined potential to the node $S_1$. If a threshold voltage of the NMOS 31 is regarded as $V_{TN}$, then the potential generating section 130 supplies a predetermined potential equivalent to a value of about $(V_{DD} - 2 V_{TN})$ to the node $S_1$. Assuming now that $V_{DD} = 5$ V and the ground potential = 0 V, the potential generating section 130 supplies a potential of about $(5 - 2 V_{TN})$ to the node $S_1$. If 2 $V_{TN}$ = about 1.7 V, then the potential supplied to the node $S_1$ becomes 3.3 V.

Figure 2:
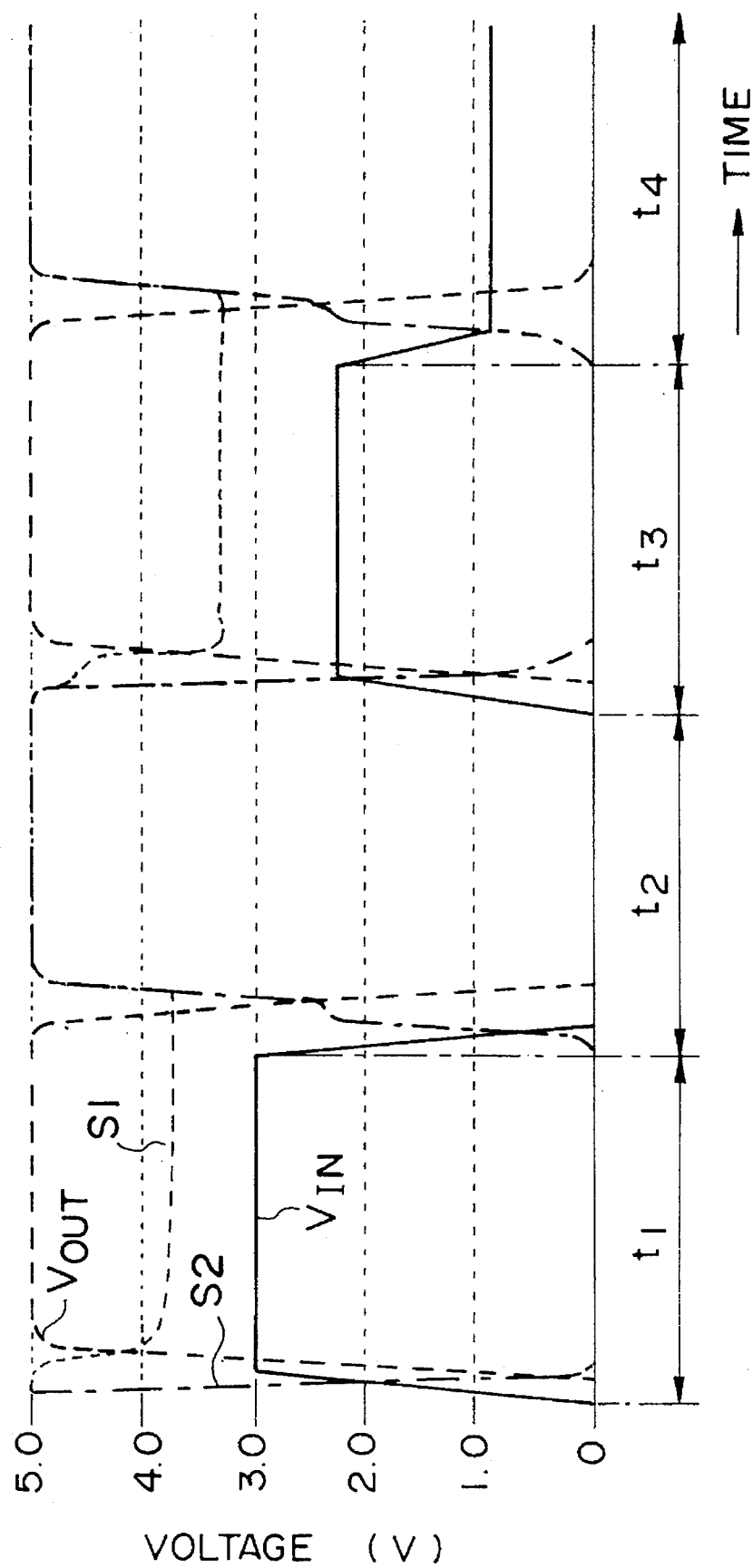
FIG. 2 is a timing chart for describing the operation of the level converting circuit shown in FIG. 1.

The operation of the level converting circuit shown in FIG. 1 will now be described below. FIG. 2 is a timing chart showing a relationship between an input signal $V_{IN}$, a potential at the node $S_1$, a potential at a node $S_2$ and an output signal $V_{OUT}$ all of which are employed in the level converting circuit shown in FIG. 1.

Now, consider a case where a signal having 0 V or 3 V is taken as the input signal $V_{IN}$. (1) If the input signal $V_{IN}=0$ V, then the NMOS 23 is brought into non-conduction and the PMOS 21 is brought into conduction. Thus, a potential corresponding to the potential at the node $S_1$ is supplied to the node $S_2$. Since the node $S_1$ is electrically coupled to the source potential generating section 110 or the voltage generating section 130, a potential of 5 V or 3.3 V is supplied to the node $S_1$. Thus, the inverter 27 is supplied with a potential which is of a high level (hereinafter called "H level") and a signal output from the inverter 27 is brought to a low level (hereinafter called "L level"). In other words, the output signal $V_{OUT}$ is brought to the L level.

Further, when the output signal of the inverter 27 is of the L level, the PMOS 29 is brought into a conducting state and the NMOS 31 is brought into a non-conducting state. Accordingly, the source potential generating section 110 supplies a potential of $V_{DD}=5$ V to the node $S_1$, i.e., the substrate with the PMOS 21 formed thereon and the source electrode of the PMOS 21. Further, the source potential generating section 110 supplies a potential corresponding to the potential at the node $S_1$ to the node $S_2$ through the PMOS 21.

(2) A description will now be made of a case where the input signal $V_{IN}=3$ V. Changes in potential of each signal and changes in potential at each node at the time that the input signal $V_{IN}=3$ V, are shown within an interval of t1 shown in FIG. 2. In this case, the NMOS 23 is brought into conduction. Thus, the ground potential generating section 120 supplies a potential of 0 V to the node $S_2$. As a result, the signal output from the inverter 27 is brought to the H level. That is, the output signal $V_{OUT}$ is brought to the H level.

Further, when the output signal of the inverter 27 is of the H level, the PMOS 29 is brought into non-conduction and the NMOS 31 is brought into conduction. Thus, the node $S_1$, i.e., the substrate with the PMOS 21 formed thereon and the source electrode of the PMOS 21 are electrically connected to the voltage generating section 130. Therefore, the potential at the node $S_1$, which was 5 V, is to take a potential $(V_{DD}-2 V_{TN})$ of about 3.3 V supplied from the voltage generating section 130.

Since, however, the gate of the PMOS 21 is supplied with the input signal of 3 V at this time, conducting and non-conducting states of the PMOS 21 vary depending on the difference between the substrate potential (the potential at the node S1 ) and the input potential. The gate electrode of the PMOS 21 and the potential applied to the substrate with the PMOS 21 formed thereon will be described below. The input signal $V_{IN}$ of 3 V is first applied to the gate of the PMOS 21. When the potential at the node S1 approaches 3.3 V from 5 V, that is when the potential applied to the substrate with the PMOS 21 formed thereon approaches 3.3 V from 5 V, the PMOS 21 is brought into the non-conducting state when the difference in potential between the gate of the PMOS 21 and the substrate becomes lower than a threshold voltage $V_{TP}$ of the PMOS 21 (that is when the substrate potential is in the course of approaching 3.3 V from 5 V).

Thus, the node $S_1$ is reduced to 3.3 V if the NMOS 31 simply exerts an effect on the node $S_1$. Since, however, the PMOS 21 is brought into non-conduction in the course of the above approach as described above, the potential at the node $S_1$ finally reaches about $(V_{IN}+VT_{PN})$ obtained by adding the threshold voltage $V_{TP}$ of the PMOS 21 to the potential of the input signal $V_{IN}$. In the illustrated embodiment, $V_{IN}+V_{TP}$ (=3 V+0.8 V) becomes equal to about 3.8 V (i.e., $V_{IN}+V_{TP}=$ about 3.8 V).

In the level converting circuit shown in FIG. 1, as has been apparent from the above description, the PMOS 21 can be brought into non-conduction by switching the potentials supplied to the node $S_1$. Thus, an on-quiescence or -idling current can be prevented from flowing in the PMOS 21, thereby making it possible to reduce power consumption.

Figure 9:
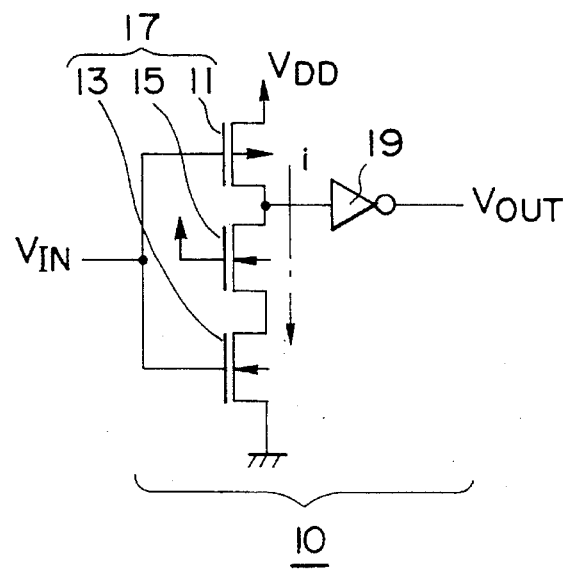
FIG. 9 is a circuit diagram showing the conventional level converting circuit for comparison.

A description will next be made of the degree to which the on-quiescence current can be prevented from flowing in the circuit shown in FIG. 1, using one example of a conventional converting circuit illustrated for comparison. FIG. 9 shows the conventional level converting circuit as an example for comparison. A PMOS 11, an NMOS 15 and an NMOS 13 are successively series-connected between a source potential $V_{DD}$ and a ground potential. The gates of the PMOS 11 and the NMOS 13 are electrically connected to an input terminal IN. Since the gate of the NMOS 15 is electrically connected to the source potential $V_{DD}$, the NMOS 15 is normally held in conduction.

Further, a node at which the PMOS 11 and the NMOS 15 are electrically connected to each other, is electrically connected to an input of an inverter 19. An output of the inverter 19 is electrically connected to an output terminal OUT.

The source of the PMOS 11 and a substrate with the PMOS 11 formed thereon are electrically connected to the source potential $V_{DD}$. Further, the source of the NMOS 13 and a substrate with the NMOS 13 formed thereon are electrically connected to the ground potential.

When an input signal $V_{IN}$ is of an H level, an output signal $V_{OUT}$ is brought to the H level. On the other hand, when the input signal $V_{IN}$ is of an L level, the output signal $V_{OUT}$ is brought to the L level. Thus, if a signal having an amplitude ranging from 0 V to 3 V, for example, is input as the input signal, then an output signal $V_{OUT}$ having an amplitude ranging from 0 V to 5 V is obtained.

Figure 3:
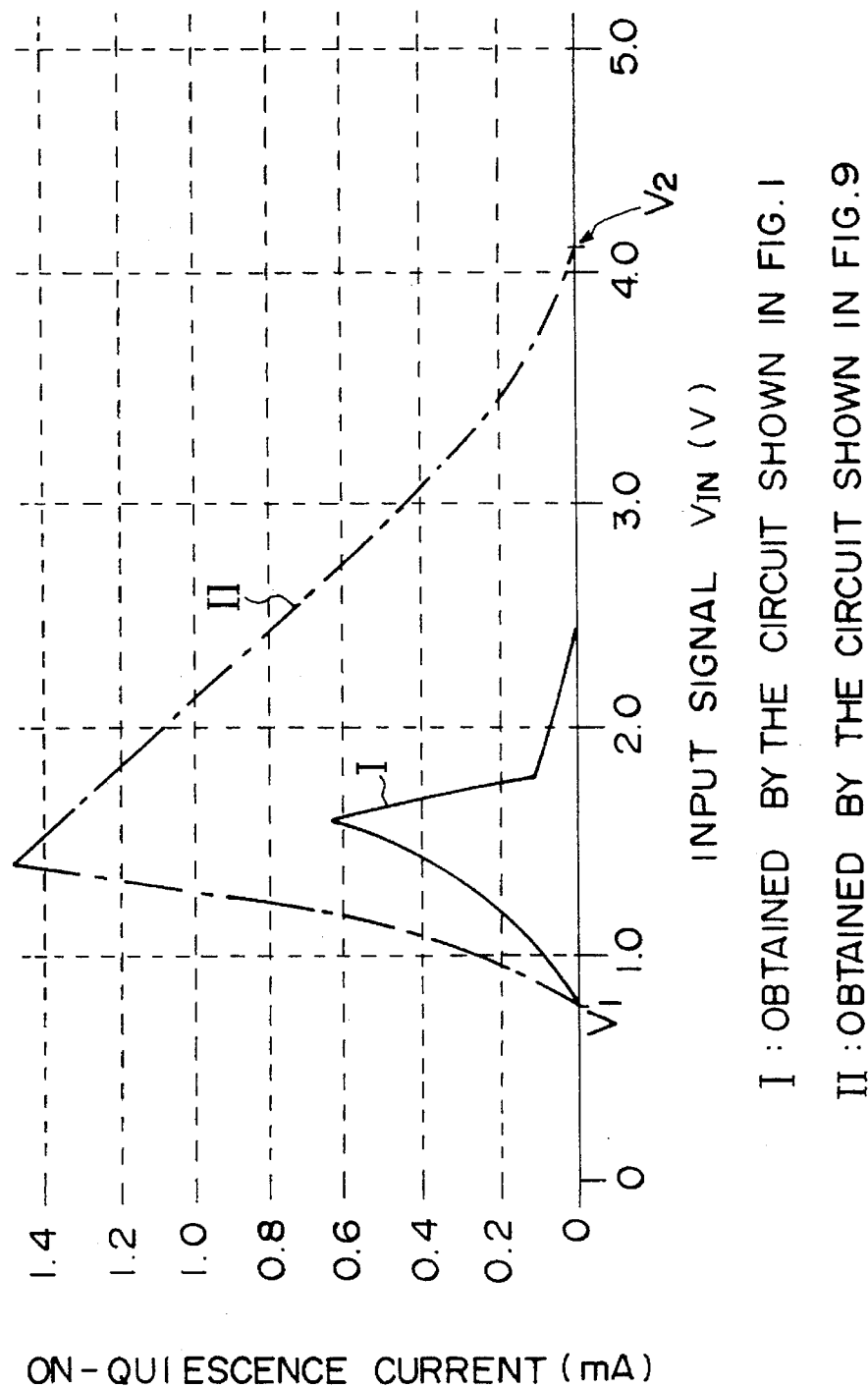
FIG. 3 is a graph for describing a relationship between an on-quiescence current and an input signal both employed in the level converting circuit shown in FIG. 1 and a conventional level converting circuit to be shown in FIG. 9.

FIG. 3 is a view showing a relationship (characteristic curves) between on-quiescence currents and input signals both employed in the level converting circuits shown in FIGS. 1 and 9. A characteristic curve (II) obtained by the level converting circuit shown in FIG. 9 is indicated by the dotted line.

The characteristic curve (II) will be described below.

Since the NMOS 13 is in a non-conducting state and the PMOS 11 is in a conducting state during a period in which the input signal $V_{IN}$ ranges from 0 V to $V_1$ ($V_1$=threshold potential of NMOS 11 ), no on-quiescence current flows. Since the NMOS 13 is brought into conduction when the input signal $V_{IN}$ exceeds $V_1$, the on-quiescence current starts to flow. Since the PMOS 11 is brought into non-conduction when the input signal $V_{IN}$ exceeds $V_2$ (a voltage obtained by subtracting the threshold voltage of the PMOS 11 from the source potential), no on-quiescence current flows.

Thus, when a signal of 3 V is used as the input signal $V_{IN}$, an on-quiescence current of about 0.4 mA continues to flow.

According to a characteristic curve (I) of the level converting circuit shown in FIG. 1, only an on-quiescence current of the order of mA indicated by the solid line in FIG. 3 flows. Since the NMOS 13 is brought into conduction when the input signal $V_{IN}$ exceeds $V_1$, the on-quiescence current first starts to flow but abruptly decreases as the potential at the node $S_1$ starts to decrease from 5 V and the potential in difference between the gate of the PMOS 21 and the substrate (node $S_1$) becomes low. This is because the PMOS 21 is brought into a state close to the non-conducting state as the difference in potential between the gate of the PMOS 21 and the substrate decreases. When the difference in potential between the gate of the PMOS 21 and the substrate becomes smaller than the threshold voltage $V_{TP}$ of the PMOS 21 ($V_3$), the PMOS 21 is completely brought into non-conduction so as to stop the on-quiescence current from flowing. In the level converting circuit shown in FIG. 1 as described above, the amount of flowing (on-quiescence) current is also greatly reduced as well as a limitation in a voltage range in which the on-quiescence current is generated, as compared with the conventional converting circuit shown in FIG. 9.

Particularly when the input signal $V_{IN}$ is of 0 V or 3 V as described previously, the amount of on-quiescence current is brought to zero. Since the on-quiescence current flows only during a period in which the input signal $V_{IN}$ falls between about 0.8 V and 2.5 V as is apparent from FIG. 3, the amount of the on-quiescence quiescence current is brought to zero even when the input signal $V_{IN}$ is of 0 V or 2.5 V, for example.

When a signal having a voltage between about 0.8 V and 2.5 V is used as the input signal $V_{IN}$ in the level converting circuit shown in FIG. 1, the on-quiescence current slightly flows but the amount of the on-quiescence current is greatly small as compared with that employed in the level converting circuit shown in FIG. 9.

Since a signal having 0 V or 5 V is applied to the input of the inverter 27 in the level converting circuit shown in FIG. 1, the generation of an on-quiescence current in the inverter 27 can also be controlled. When a potential of 3.3 V is applied to the input of the inverter 27, for example, an on-quiescence current is generated within the inverter 27.

In the level converting circuit shown in FIG. 1, when the input signal $V_{IN}$ is 0 V, the source of the PMOS 21 is brought to 5 V. On the other hand, when the input signal $V_{IN}$ is 3 V, the source of the PMOS 21 is brought to about 3.8 V. Therefore, if the input signal $V_{IN}$ is 3 V rather than 0 V, a sense level of each of the PMOS 21 and the NMOS 23 is set to a lower level. Thus, the level converting circuit shown in FIG. 1 can also perform a function of a schmitt trigger circuit.

However, the control of the on-quiescence current does not necessarily require to connect the substrate with the PMOS 21 formed thereon and the source of the PMOS 21 to each other. Namely, the on-quiescence current can be controlled by simply connecting the source potential generating section 110 or the potential generating section 130 directly to the substrate.

A relationship between an input signal $V_{IN}$, a potential at the node $S_1$, a potential at the node $S_2$ and an output signal $V_{OUT}$ at the time that a signal having an amplitude ranging from 2.2 V to 0.8 V is used as the input signal $V_{IN}$, will be shown between intervals $t_3$ and $t_4$ shown in FIG. 2.

An operation principle in this case is identical to that between the intervals $t_1$ and $t_2$ shown in FIG. 2 and its description will therefore be omitted.

Figure 4:
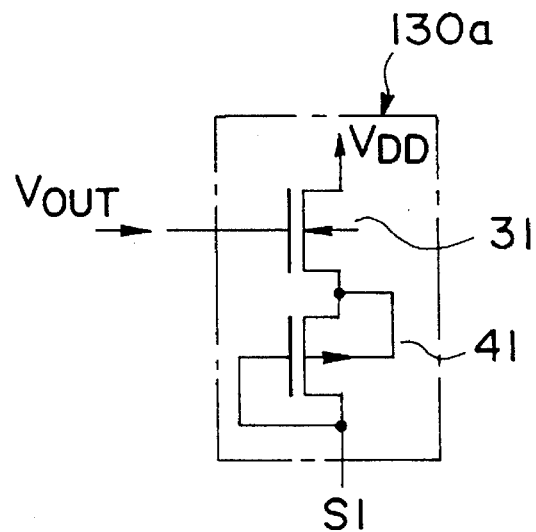
FIG. 4 is a circuit diagram showing another example of a potential generating section 130 shown in FIG. 1.

FIG. 4 shows another example of the potential generating section 130 in the level converting circuit shown in FIG. 1. The voltage or potential generating section 130a shown in FIG. 4 is composed of an NMOS 31 and a PMOS 41 electrically series-connected between a source potential node $V_{DD}$ and a node $S_1$. The gate of the NMOS 31 is electrically connected to an output terminal $V_{OUT}$, i.e., the output of the inverter 27. The gate of the PMOS 41 is electrically connected to the node $S_1$ and the source thereof is electrically connected to a substrate with the PMOS 41 formed thereon.

In the potential generating section 130a, a voltage corresponding to a threshold voltage of the PMOS 41 is further reduced as compared with the potential generating section 130 shown in FIG. 1. It is therefore possible to supply a voltage of about 2.5 V to the node $S_1$.

Thus, the on-quiescence current can be controlled even in the case of a voltage range lower than that employed in the level converting circuit shown in FIG. 1, e.g., $V_{IN}$=2.2 V that is of a normalized value of a TTL input interface.

Figure 5:
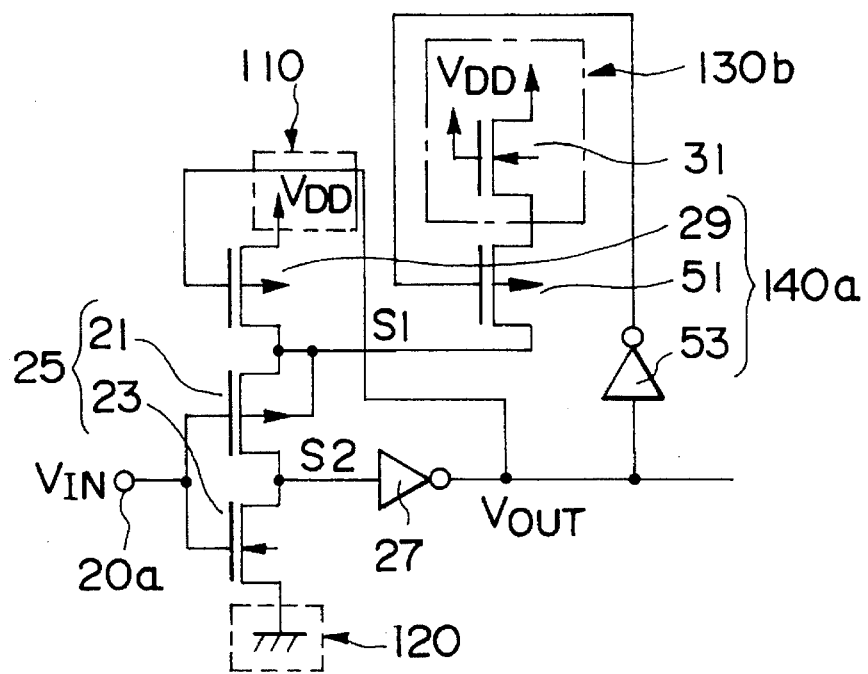
FIG. 5 is a circuit diagram illustrating a level converting circuit according to a second embodiment of the present invention.

FIG. 5 is a circuit diagram illustrating a level converting circuit according to a second embodiment of the present invention. The configuration of the level converting circuit will be described below. The same elements as those shown in FIG. 1 are identified by like reference numerals and their description will therefore be omitted. The dissimilarities between the level converting circuit shown in FIG. 5 and the level converting circuit shown in FIG. 1 will be described in detail. A potential generating section 130b is composed of an NMOS 31. The gate and source of the NMOS 31 are electrically connected to a source potential node $V_{DD}$. Thus, the NMOS 31 is held in conduction at all times. Further, a PMOS $S_1$ is electrically connected between the drain of the NMOS 31 and a node $S_1$. The input of an inverter 53 is electrically connected to the output of an inverter 27 and the output thereof is electrically connected to the gate of a PMOS 51.

In the level converting circuit shown in FIG. 5, the supply of a potential from the potential generating section 130b to the node $S_1$ can be controlled by turning on and off the PMOS $S_1$.

Figure 6:
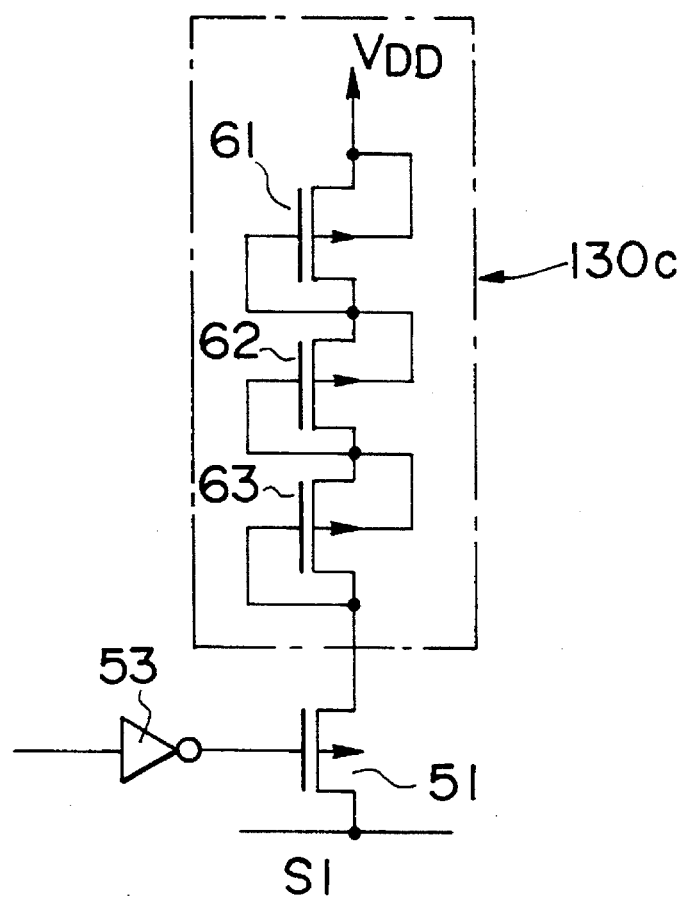
FIG. 6 is a circuit diagram showing another example of a potential generating section 130b shown in FIG. 5.

FIG. 6 illustrates another example of the potential generating section 130b in the level converting circuit shown in FIG. 5. The potential generating section 130c is composed of three PMOSs 61, 62 and 63 electrically series-connected between a source potential $V_{DD}$ and a PMOS $S_1$. The source of the PMOS 61 is electrically connected to a substrate with the PMOS 61 formed thereon and the drain of the PMOS 61 is electrically connected to the gate of the PMOS 61. The PMOSs 62 and 63 are connected in the same manner as described above.

Even in the case of the level converting circuit shown in FIG. 5 or in the case where the potential generating section in the level converting circuit shown in FIG. 5 is replaced by the potential generating section shown in FIG. 6, a PMOS 21 is brought into an off state even if the voltage of an input signal $V_{IN}$ is equal to 2.2 V that is of a normalized value of a TTL input interface circuit, for example (i.e., $V_{IN}$=2.2 V). Therefore, an onquiescence quiescence current can be restrained from flowing.

Since the three PMOSs 61, 62 and 63 are used as for voltage drop in the potential generating section 130c, a time interval required to change the potential at the node $S_2$ from an L level to an H level is delayed. Thus, the potential generating section 130c can provide a signal delay function. The delay time can be adjusted by reducing the ratio of each gate width of some or all of the PMOSs 61, 62 and 63 to each gate length thereof.

Figure 7:
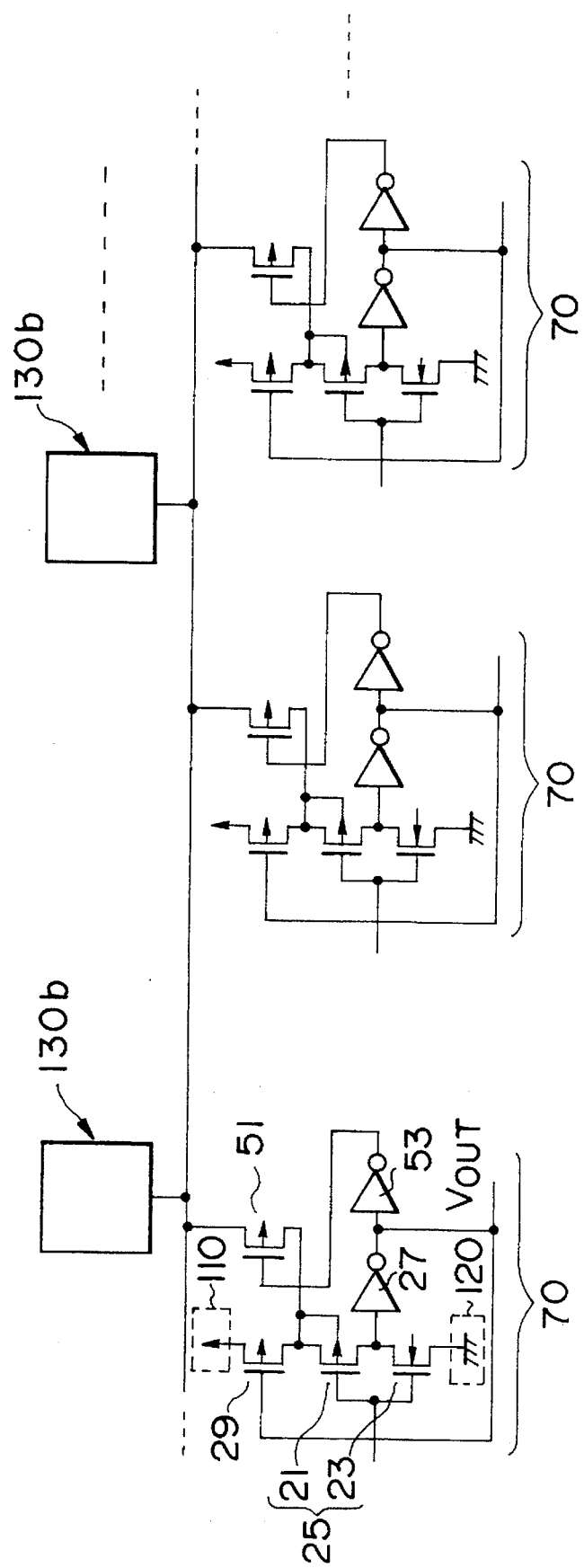
FIG. 7 is a view illustrating the manner in which a plurality of level converting circuits are electrically connected to one another.

FIG. 7 is a view illustrating the manner in which level converting circuits are electrically connected to each other. A circuit section other than the potential generating section 130b of the level converting circuit shown in FIG. 5 will be used as a partial circuit 70. The partial circuit 70 is prepared in plural form and the sources of the PMOSs $S_1$ of the prepared partial circuits 70 are commonly connected to one another. The drain of an NMOS 31 in each potential generating section 130b is electrically connected to such a common connecting point. It is needless to say that others may be used as the potential generating sections. In FIG. 7, three partial circuits 70 and two potential generating sections are used. It is not necessary to provide a single potential generating section 130b with respect to a single partial circuit 70. Namely, a single potential generating section may be shared between a plurality of partial circuits 70. Further, when a plurality of partial circuits 70 and a plurality of potential generating sections are connected to one another, it is preferable that they are disposed uniformly with respect to a wire not so as to be concentrated on a single point on the wire. The potential can be stably supplied owing to this disposition.

Each of the partial circuits 70 shown in FIG. 7 may be used as a circuit section other than the potential generating section 130 in the level converting circuit shown in FIG. 1.

Figure 8:
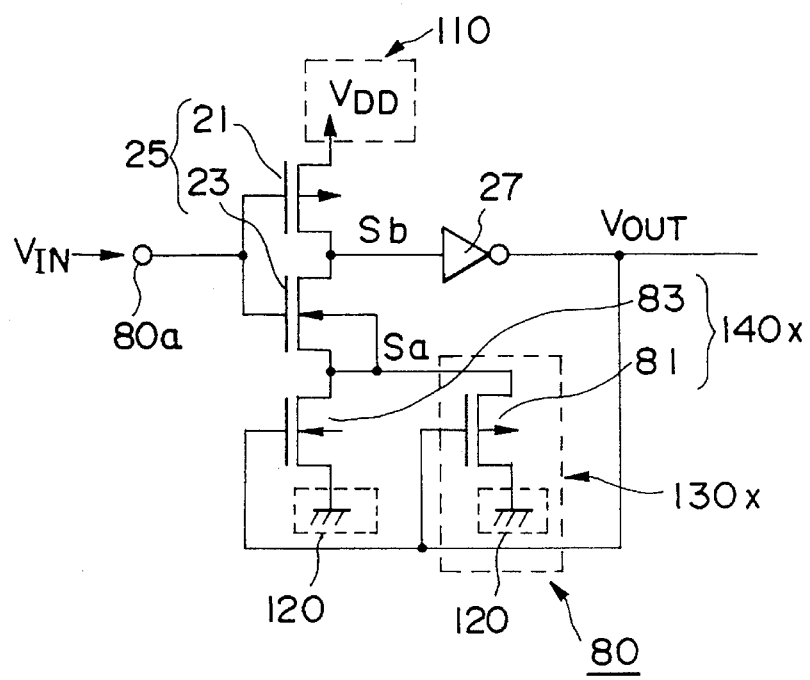
FIG. 8 is a circuit diagram depicting a level converting circuit according to a third embodiment of the present invention.

FIG. 8 is a circuit diagram showing a level converting circuit according to a third embodiment of the present invention. The configuration of the level converting circuit will be described below. A PMOS 21 and an NMOS 23 are electrically series-connected between a source potential 110 and a node $S_a$. Described specifically, the source of the PMOS 21 is electrically connected to the source potential 110 and the drain thereof is electrically connected to the drain of the NMOS 23. The source of the PMOS 23 is electrically connected to the node $S_a$. Further, the gates of these MOS transistors are electrically connected to an input terminal IN. These MOS transistors constitutes an inverter 25. The source of the NMOS 23 is electrically connected to a substrate with the NMOS 23 formed thereon. An output $S_b$ of the inverter 25, i.e., a point $S_b$ at which the PMOS 21 and the NMOS 23 are electrically connected to each other, is electrically connected to an input of the inverter 27. An output of the inverter 27 is electrically coupled to an output terminal OUT.

An NMOS 83 and a PMOS 81 are electrically parallel-connected between a ground potential 120 and the node $S_a$. Described specifically, the drains of the NMOS 83 and the PMOS 81 are electrically connected to the ground potential 120 and the sources thereof are electrically connected to the node $S_a$. The gates of these MOS transistors are electrically coupled to the output of the inverter Now, the ground potential 120 and the PMOS 81 forms a potential or voltage generating section 130x, which supplies a predetermined potential to the node $S_a$. Namely, when the threshold voltage of the PMOS 81 is taken as $V_{PT}$, a predetermined potential equivalent to a value of about (ground potential+2 $V_{PT}$) is supplied to the node $S_b$. If $V_{DD}$=5 V and the ground potential=0 V, then the potential generating section 130x supplies a potential of (0+2 $V_{PT}$) to the node $S_a$. If 2 $V_{TP}$=about 1.5 V, then the potential supplied to the node $S_1$ reaches 1.5 V.

The operation of the level converting circuit shown in FIG. 8 will now be described.

Now, consider a case where a signal having 2 V or 5 V is regarded as an input signal $V_{IN}$.

(1) When the input signal $V_{IN}$=5 V, the NMOS 23 and the PMOS 21 are respectively brought into conduction and non-conduction. Thus, a potential corresponding to the potential at the node $S_a$ is supplied to the node $S_b$. Since the node $S_a$ is electrically connected to the ground potential 120 or the potential generating section 130x, a potential of 0 V or 1.5 V is supplied to the node $S_a$. Thus, since the inverter 27 is supplied with a potential of an L level, a signal output from the inverter 27 is brought to an H level. Namely, an output signal $V_{OUT}$ is brought to the H level.

Further, when the output signal of the inverter 27 is of the H level, the NMOS 83 is brought into conduction and the PMOS 81 is brought into non-conduction. Thus, the node $S_a$, i.e., the substrate with the NMOS 23 formed thereon and the source of the NMOS 23 are supplied with a potential of 0 V from the ground potential 120. Further, a potential corresponding to the potential (0 V) at the node $S_a$ is supplied to the node $S_b$ through the NMOS 23.

(2) A description will now be made of a case where the input signal $V_{IN}$=2 V. In this case, the PMOS 21 is brought into a conducting state. Accordingly, the source potential 110 supplies a potential of 5 V to the node $S_b$. As a result, the output signal of the inverter 27 is brought to an L level. Namely, the output signal $V_{OUT}$ is brought to the L level.

Further, when the output signal of the inverter 27 is of the L level, the NMOS 83 is brought into non-conduction and the PMOS 81 is brought into conduction. Thus, the node $S_a$, i.e., the substrate with the NMOS 23 formed thereon and the source of the NMOS 23 are electrically connected to the potential generating section 130x. Therefore, the potential at the node $S_1$, which was 0 V, approaches a potential (ground potential–2 $V_{TP}$) of about 1.5 V supplied from the potential generating section 130x.

Thus, at this time, the NMOS 23 is brought into non-conduction regardless of the fact that an input signal having 2 V has been applied to the gate of the NMOS 23. As a result, an onquiescence current can be controlled even if the potential of the input signal $V_{IN}$ is of 2 V.

Further, since the substrate with the NMOS 23 formed thereon and the source of the NMOS 23 are electrically connected to each other in the level converting circuit shown in FIG. 8, the potential applied to the source of the NMOS 23 varies in a manner similar to the substrate potential. Therefore, a function of a schmitt trigger circuit can also be achieved in the same manner as in the case of the level converting circuit shown in FIG. 1.

Incidentally, the level converting circuit shown in FIG. 8 can be also applied in a manner similar to the level converting circuits shown in FIGS. 4, 5 and 6. In this case, a configuration may be adopted in which the difference between the PMOS and the NMOS has been taken into consideration.

Each of the inverters employed in the level converting circuits described above may include another circuit which is disposed between the PMOS and the NMOS.

According to each of the level converting circuits of the present invention, as has been described above, since a potential supplied to a node $S_1$ or $S_b$ is switched according to an input signal, an NMOS connected to the node $S_1$ or $S_b$ can be brought into non-conduction. Therefore, the NMOS is not brought into conduction beyond need, thus making it possible to control or suppress an on-quiescence current.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A level converting circuit comprising:

a first inverter including a P channel MOS transistor and an N channel MOS transistor series-connected between a first node and a ground potential node;

a second inverter connected to an output of said first inverter;

a source potential supply circuit for supplying a source potential to the first node; and a potential supply circuit for supplying a potential lower than the source potential to the first node;

wherein said source potential supply circuit supplies a source potential to the first node when a signal input to said first inverter is of an L level and said potential supply circuit supplies a potential lower than the source potential to the first node when the signal input to said first inverter is of an H level.

2. A level converting circuit comprising:

a first inverter including a P channel MOS transistor and an N channel MOS transistor series-connected between a first node and a ground potential node;

a second inverter connected to an output of said first inverter;

a source potential supply circuit for supplying a source potential to the first node; and a potential supply circuit for supplying a potential lower than the source potential to the first node;

wherein said potential supply circuit comprises a first switching element connected between a source potential node and the first node, said first switching element being activated in response to a signal output from said second inverter.

3. The level converting circuit according to claim 2, wherein said potential supply circuit comprises a MOS transistor connected between the first switching element and the first node.

4. The level converting circuit according to claim 2, wherein said potential supply circuit comprises a second N channel MOS transistor connected to the source potential node and a second switching element connected between said second N channel MOS transistor and the first node is activated in response to the inverse of the output signal of the second inverter to control the supply of a potential to the first node.

5. A level converting circuit comprising:

a first inverter including a P channel MOS transistor and an N channel MOS transistor series-connected between a source potential node and a first node;

a second inverter connected to an output of said first inverter;

a ground potential supply circuit for supplying a ground potential to the first node; and a potential supply circuit for supplying a potential higher than the ground potential to the first node;

wherein said ground potential supply circuit supplies a ground potential to the first node when a signal input to said first inverter is of an H level and said potential supply circuit supplies a potential higher than the ground potential to the first node when the signal input to said first inverter is of an L level.

6. The level converting circuit according to claim 2, wherein said first switching element is an N channel MOS transistor.

7. The level converting circuit according to claim 2, wherein said source potential supply circuit is a P channel MOS transistor connected to the source potential.

8. The level converting circuit according to claim 2, wherein said potential supply circuit includes a plurality of N channel MOS transistors electrically series-connected between said first switching element and the source potential.

9. A level converting circuit comprising:

a first inverter including a first P channel MOS transistor and a first N channel MOS transistor series-connected between a first node and a ground potential node, the respective drains of the first P and N channel MOS transistors being connected to each other at an output of said first inverter, the sources of the first P and N channel MOS transistors being connected, respectively, to the first node and ground potential node, and the gates of said first P and N channel MOS transistors being connected to each other at an input node;

a second P channel MOS transistor connected between a source of potential and the first node for supplying a source potential to the first node;

a second N channel MOS transistor connected between the source of-potential and the first node for supplying a potential lower than the source potential to the first node; and a second inverter having an input connected to the output of said first inverter, and an output connected to respective gates of said second P and N channel MOS transistors;

wherein said second P channel MOS transistor supplies the source potential to the first node when an input signal at the input node of said first inverter is of an L level, and said second channel MOS transistor supplies the potential lower than the source potential to the first node when the input signal is of an H level.

10. The level converting circuit according to claim 9, wherein the source of the first P channel MOS transistor is connected to a substrate on which said first P channel MOS transistor is formed.

11. A level converting circuit comprising:

a first inverter including a first P channel MOS transistor and a first N channel MOS transistor series-connected between a first node and a ground potential node, the respective drains of the first P and N channel MOS transistors being connected to each other at an output of said first inverter, the sources of the first P and N channel MOS transistors being connected, respectively, to the first node and ground potential node, and the gates of said first P and N channel MOS transistors being connected to each other at an input node;

a substrate on which said first P channel MOS transistor is formed;

a second P channel MOS transistor connected to a source of potential for supplying a source potential;

a second N channel MOS transistor connected to the source of potential for supplying a potential lower than the source potential and a second inverter having an input connected to the output of said first inverter, and an output connected to respective gates of said second P and N channel MOS transistors;

wherein the second P channel and second N channel MOS transistors are connected to said substrate so that said second P channel MOS transistor supplies the source potential to the substrate when an input signal at the input node of said first inverter is of an H level, and said second N channel MOS transistor supplies the potential lower than the source potential to the substrate when the input signal is of an L level.

12. The level converting circuit according to claim 11, wherein the source of the first P channel MOS transistor is connected to said substrate.

* * * * *